(12) United States Patent
Gurary et al.

(10) Patent No.: US 10,134,617 B2
(45) Date of Patent: Nov. 20, 2018

(54) WAFER CARRIER HAVING THERMAL COVER FOR CHEMICAL VAPOR DEPOSITION SYSTEMS

(71) Applicant: Veeco Instruments, Inc, Plainview, NY (US)

(72) Inventors: Alexander I. Gurary, Bridgewater, NJ (US); Eric Armour, Plainview, NY (US)

(73) Assignee: Veeco Instruments Inc., Plainview, NY (US)

( * ) Notice: Subject to any disclaimer, the term of this patent is extended or adjusted under 35 U.S.C. 154(b) by 618 days.

(21) Appl. No.: 14/583,346

(22) Filed: Dec. 26, 2014

(65) Prior Publication Data

US 2015/0187620 A1   Jul. 2, 2015

Related U.S. Application Data

(60) Provisional application No. 61/920,943, filed on Dec. 26, 2013.

(51) Int. Cl.
| | |
|---|---|
| *H01L 21/673* | (2006.01) |
| *C23C 16/458* | (2006.01) |
| *C23C 16/46* | (2006.01) |
| *H01L 21/687* | (2006.01) |

(52) U.S. Cl.
CPC .... *H01L 21/67333* (2013.01); *C23C 16/4584* (2013.01); *C23C 16/46* (2013.01); *H01L 21/68735* (2013.01); *H01L 21/68764* (2013.01); *H01L 21/68771* (2013.01); *Y10T 29/49826* (2015.01); *Y10T 29/49837* (2015.01)

(58) Field of Classification Search
None
See application file for complete search history.

(56) References Cited

U.S. PATENT DOCUMENTS

| | | |
|---|---|---|
| 3,895,967 A | 7/1975 | Anthony et al. |
| 5,152,842 A | 10/1992 | Urata |
| 5,242,501 A | 9/1993 | McDiarmid |

(Continued)

FOREIGN PATENT DOCUMENTS

| | | |
|---|---|---|
| DE | 10261362 | 5/2008 |
| EP | 0795624 | 9/1997 |

(Continued)

OTHER PUBLICATIONS

Machine Generated English Translation of KR100854974. Published Aug. 28, 2008.*

(Continued)

*Primary Examiner* — Sylvia MacArthur
(74) *Attorney, Agent, or Firm* — Patterson Thuente Pedersen, P.A.

(57) ABSTRACT

The invention relates generally to semiconductor fabrication technology and, more particularly, to chemical vapor deposition (CVD) processing and associated apparatus for addressing temperature non-uniformities on semiconductor wafer surfaces. Embodiments include a wafer carrier for use in a system for growing epitaxial layers on one or more wafers by CVD, the wafer carrier comprising a top plate and base plate which function coordinately to reduce temperature variability caused during CVD processing.

14 Claims, 9 Drawing Sheets

(56) References Cited

U.S. PATENT DOCUMENTS

| | | |
|---|---|---|
| 5,690,742 A | 11/1997 | Ogata |
| 6,001,183 A | 12/1999 | Guary et al. |
| 6,436,796 B1 | 8/2002 | Mailho et al. |
| 6,492,625 B1 | 12/2002 | Boguslayskiy et al. |
| 6,506,252 B2 | 1/2003 | Boguslayskiy et al. |
| 6,666,756 B1 | 12/2003 | Travis |
| 6,902,623 B2 | 6/2005 | Gurary et al. |
| 7,101,272 B2 | 9/2006 | Chen et al. |
| 7,122,844 B2 | 10/2006 | Nakamura |
| 7,276,124 B2 | 10/2007 | Gurary et al. |
| 8,021,487 B2 | 9/2011 | Boguslayskiy et al. |
| 8,092,599 B2 | 1/2012 | Sferlazzo et al. |
| 8,093,696 B2 | 1/2012 | Yoon |
| 8,366,830 B2 | 2/2013 | Nakamura et al. |
| 8,367,477 B2 | 2/2013 | Chien |
| 8,372,204 B2 | 2/2013 | Nakamura et al. |
| 8,486,726 B2 | 7/2013 | Mangum et al. |
| 8,518,753 B2 | 8/2013 | Wu |
| 8,535,445 B2 | 9/2013 | Volf et al. |
| 8,552,547 B2 | 10/2013 | Chien |
| 8,562,746 B2 | 10/2013 | Gurary et al. |
| 8,603,248 B2 | 12/2013 | Guary et al. |
| 9,017,483 B2 | 4/2015 | Fujikawa et al. |
| 2005/0011436 A1 | 1/2005 | Liu |
| 2005/0274374 A1* | 12/2005 | Boguslavskiy .......... C21D 7/06 126/92 AC |
| 2007/0186853 A1 | 8/2007 | Gurary et al. |
| 2009/0155028 A1 | 6/2009 | Boguslavskiy et al. |
| 2010/0055318 A1 | 3/2010 | Volf et al. |
| 2010/0055320 A1 | 3/2010 | Honma |
| 2011/0049779 A1 | 3/2011 | Egami |
| 2011/0290175 A1* | 12/2011 | Paranjpe ............... C30B 25/025 117/85 |
| 2011/0300297 A1 | 12/2011 | Celaru et al. |
| 2012/0040097 A1 | 2/2012 | Volf et al. |
| 2012/0156374 A1* | 6/2012 | Gurary ................ C23C 16/4584 427/255.28 |
| 2012/0234229 A1 | 9/2012 | Nguyen et al. |
| 2012/0272892 A1 | 11/2012 | Paranjpe et al. |
| 2013/0175005 A1 | 7/2013 | Gowdaru et al. |
| 2013/0291798 A1 | 11/2013 | Lee et al. |
| 2014/0110894 A1 | 4/2014 | Lee |
| 2014/0261187 A1 | 9/2014 | Krishnan et al. |
| 2014/0261698 A1* | 9/2014 | Krishnan ................ C30B 25/12 137/1 |
| 2014/0360430 A1* | 12/2014 | Armour .............. C23C 16/4586 118/725 |
| 2015/0187620 A1* | 7/2015 | Gurary ................ C23C 16/4584 118/728 |
| 2016/0251758 A1* | 9/2016 | Mitrovic ........... C23C 16/45504 438/478 |
| 2017/0121847 A1* | 5/2017 | Armour .............. C23C 16/4586 |

FOREIGN PATENT DOCUMENTS

| | | |
|---|---|---|
| EP | 1096549 | 5/2001 |
| JP | 58128724 | 8/1983 |
| JP | 4110466 | 4/1992 |
| JP | 10167885 | 6/1998 |
| JP | 10167886 | 6/1998 |
| JP | 2004128271 | 4/2004 |
| JP | 2006066417 | 3/2006 |
| JP | 5156240 | 3/2013 |
| KR | 100854974 | 8/2008 |
| KR | 1020090038606 | 4/2009 |
| KR | 1020090036722 | 2/2012 |
| WO | WO 99/18599 | 4/1999 |
| WO | WO 2003/069029 | 8/2003 |
| WO | WO 2012/021370 | 2/2012 |
| WO | WO 2013/123859 | 8/2013 |

OTHER PUBLICATIONS

Application and file history for related U.S. Appl. No. 14/297,244, filed Jun. 5, 2014, Inventors Armour et al.

International Search Report from PCT Application PCT/US2011/0456567, dated Dec. 21, 2011, 6 pgs.

Guary et al. "Investigation of the Wafer Temperature Uniformity in an OMVPE Vertical Rotating Disk Reactor", Journal of Electronic Material, Nov. 1995, vol. 24, Issue 11, Abstract, 1 pg.

International Search Report and Written Opinion from PCT Application PCT/US2014/041134, dated Oct. 7, 2014, 11 pgs.

Application and file history for U.S. Appl. No. 15/403,709, filed Jan. 11, 2017. Inventors: Armour et al.

Application No. PCT/US2014/072425, filed Dec. 26, 2014, International Search Report dated Apr. 29, 2015, 3 pages.

Application No. PCT/US2014/072425, filed Dec. 26, 2014, Written Opinion dated Apr. 29, 2015, 7 pages.

International Search Report and Written Opinion for International Application No. PCT/US2011061615 dated May 18, 2012.

Taiwan Application No. 103145394, Search Report dated Jan. 9, 2018, 9 page.

* cited by examiner

Carrier with CVD SiC covers (GaN)

Cover Carrier (Tav. - 1055.3C, STD - 4.1 C)      Standard Carrier (Tav. - 1048 C, STD - 4.3 C)

Tangential Temperature Profiles – Cover Carrier      Tangential Temperature Profiles – Standard Carrier

| | Standard carrier MQW | Cover carrier MQW | Standard carrier GaN | Cover carrier GaN |
|---|---|---|---|---|
| Tcarrier | 788.9 | 790.0 | 1089.1 | 1030 |
| Twaffer (by BP) | 747.3 | 795.3 | 1061.8 | 1046.5 |
| Tcar-Twaf | 41.6 | -5.3 | 27.3 | -16.5 |

FIG. 9B

WAFER CARRIER HAVING THERMAL COVER FOR CHEMICAL VAPOR DEPOSITION SYSTEMS

PRIOR APPLICATION

This Application claims priority to U.S. Provisional Application No. 61/920,943 filed Dec. 26, 2013, the content of which is incorporated by reference herein.

FIELD OF THE INVENTION

The invention relates generally to semiconductor fabrication technology and, more particularly, to chemical vapor deposition (CVD) processing and associated apparatus having features for reducing temperature non-uniformities on semiconductor wafer surfaces.

BACKGROUND OF THE INVENTION

In the fabrication of light-emitting diodes (LEDs) and other high-performance devices such as laser diodes, optical detectors, and field effect transistors, a chemical vapor deposition (CVD) process is typically used to grow a thin film stack structure using materials such as gallium nitride over a sapphire or silicon substrate. A CVD tool includes a process chamber, which is a sealed environment that allows infused gases to be deposited upon the substrate (typically in the form of wafers) to grow the thin film layers. An example of a current product line of such manufacturing equipment is the TurboDisc® family of metal organic chemical vapor deposition (MOCVD) systems, manufactured by Veeco Instruments Inc. of Plainview, N.Y.

A number of process parameters are controlled, such as temperature, pressure, and gas flow rate, to achieve a desired crystal growth. Different layers are grown using varying materials and process parameters. For example, devices formed from compound semiconductors such as III-V semiconductors are typically formed by growing successive layers of the compound semiconductor using MOCVD. In this process, the wafers are exposed to a combination of gases, including a metal organic compound as a source of a group III metal, and also including a source of a group V element which flow over the surface of the wafer while the wafer is maintained at an elevated temperature. Generally, the metal organic compound and group V source are combined with a carrier gas, which does not participate appreciably in the reaction as, for example, nitrogen. One example of a III-V semiconductor is gallium nitride, which can be formed by reaction of an organo-gallium compound and ammonia on a substrate having a suitable crystal lattice spacing, as for example, a sapphire wafer. The wafer is usually maintained at a temperature on the order of 1000-1100° C. during deposition of gallium nitride and related compounds.

In MOCVD processing, where the growth of crystals occurs by chemical reaction on the surface of the substrate, the process parameters must be tightly controlled to ensure that the chemical reaction proceeds under the required conditions. Even small variations in process conditions can adversely affect device quality and production yield. For instance, if a gallium and indium nitride layer is deposited, variations in wafer surface temperature will cause variations in the composition and bandgap of the deposited layer. Because indium has a relatively high vapor pressure, the deposited layer will have a lower proportion of indium and a greater bandgap in those regions of the wafer where the surface temperature is higher. If the deposited layer is an active, light-emitting layer of an LED structure, the emission wavelength of the LEDs formed from the wafer will also vary to an unacceptable degree.

In an MOCVD processing chamber, semiconductor wafers on which layers of thin film are to be grown are placed on rapidly-rotating carousels, referred to as wafer carriers, to provide a uniform exposure of their surfaces to the atmosphere within the reactor chamber for the deposition of the semiconductor materials. Rotation speed is on the order of 1,000 RPM. The wafer carriers are typically machined out of a highly thermally conductive material such as graphite, and are often coated with a protective layer of a material such as silicon carbide. Each wafer carrier has a set of circular indentations, or pockets, in its top surface in which individual wafers are placed. Typically, the wafers are supported in spaced relationship to the bottom surface of each of the pockets to permit the flow of gas around the edges of the wafer. Some examples of pertinent technology are described in U.S. Patent Application Publication No. 2012/0040097, U.S. Pat. No. 8,092,599, U.S. Pat. No. 8,021,487, U.S. Patent Application Publication No. 2007/0186853, U.S. Pat. No. 6,902,623, U.S. Pat. No. 6,506,252, and U.S. Pat. No. 6,492,625, the disclosures of which are incorporated by reference herein.

The wafer carrier is supported on a spindle within the reaction chamber so that the top surface of the wafer carrier having the exposed surfaces of the wafers faces upwardly toward a gas distribution device. While the spindle is rotated, the gas is directed downwardly onto the top surface of the wafer carrier and flows across the top surface toward the periphery of the wafer carrier. The used gas is evacuated from the reaction chamber through ports disposed below the wafer carrier. The wafer carrier is maintained at the desired elevated temperature by heating elements, typically electrical resistive heating elements disposed below the bottom surface of the wafer carrier. These heating elements are maintained at a temperature above the desired temperature of the wafer surfaces, whereas the gas distribution device typically is maintained at a temperature well below the desired reaction temperature so as to prevent premature reaction of the gases. Therefore, heat is transferred from the heating elements to the bottom surface of the wafer carrier and flows upwardly through the wafer carrier to the individual wafers. The gas flow over the wafers varies depending on the radial position of each wafer, with outermost-positioned wafers being subjected to higher flow rates due to their faster velocity during rotation. Even each individual wafer can have temperature non-uniformities, i.e., cold spots and hot spots depending upon its geometrical position relative to the other wafers on the carrier.

During MOCVD processing, the wafer carrier is predominantly heated by radiation, with the radiant energy impinging on the bottom of the carrier. For example, a cold-wall CVD reactor design (i.e., one that uses non-isothermal heating from the bottom) creates conditions in the reaction chamber where a top surface of the wafer carrier is cooler than the bottom surface. The degree of radiative emission from the wafer carrier is determined by the emissivity of the carrier and the surrounding components. Changing the interior components of the reaction chamber such as the cold-plate, confined inlet flange, shutter, and other regions, to a higher emissivity material can result in increased radiative heat transfer. Likewise, reducing the emissivity of the carrier will result in less radiative heat removal from the carrier. The degree of convective cooling of the carrier surface is driven by the overall gas flow pumping through the chamber, along with the heat capacity of the gas mixture (H2, N2, NH3, OMs, etc.). Additionally, introducing a wafer, such as a sapphire wafer, in a pocket can enhance the transverse component of the thermal streamlines, resulting in a "blanketing" effect. This phenomenon results in a radial thermal profile at the pocket floor that is hotter in the center and lower towards the outer radius of the pocket.

This non-uniform temperature profile on the surface of the wafer, which is compounded by centripetal forces during rotation (i.e., the "proximity" effect), can significantly decrease semiconductor production yield. Thus, a great deal of effort has been devoted to designing a system with features to minimize temperature variations during processing. Given the extreme conditions wafers are subject to during MOCVD processing, and the impact these conditions have on production yield, there remains a need for improved technologies to further reduce temperature non-uniformities.

SUMMARY OF THE INVENTION

Aspects of the invention are directed to a chemical vapor deposition (CVD) system in which temperature non-uniformities on the surfaces of semiconductor wafers are significantly reduced. In one aspect, a wafer carrier has a body formed symmetrically about a central axis, and including a generally planar top surface that is situated perpendicularly to the central axis. A plurality of wafer retention pockets are recessed in the body from the top surface. Each of the wafer retention pockets includes a floor surface generally parallel to the top surface; and a peripheral wall surface surrounding the floor surface and defining a periphery of that wafer retention pocket. Each wafer retention pocket has a pocket center situated along a corresponding wafer carrier radial axis that is perpendicular to the central axis.

In various embodiments, a wafer carrier for use in a system for growing epitaxial layers on one or more wafers by CVD can comprise a top plate and a base plate, wherein the top plate covers the areas of the base plate not covered by one or more wafers, and wherein the presence of the top plate reduces temperature variability during CVD processing. The top plate can comprise the same material as the plurality of wafers, for example, silicon or sapphire; or the top plate can comprise a similar material as the plurality of wafers, for example, quartz, silicon carbide, solid silicon carbide, or aluminum nitride. In such embodiments, the base plate can generally be comprised of either silicon carbide or silicon carbide coated graphite. In various embodiments, temperature non-uniformities can be reduced when the top plate and the plurality of wafers are in the same horizontal plane within the wafer carrier. In other embodiments, temperature non-uniformities can be reduced when the top plate and the plurality of wafers are the same distance from the base plate. For example, the wafers and the top plate or top plates can rest on tabs or ring structures extending from the base plate, such that the gap distance between the wafers and the top surface of the wafer pocket is the same or similar as the gap distance between the top plates and the top surface of the base plate in the regions not occupied by wafers.

In other embodiments, temperature non-uniformities can be reduced when the top plate and the plurality of wafers are the same thickness. For example, the top plate and the plurality of wafers can be in the same horizontal plane and be in direct contact, or top plate and the plurality of wafers can be in the same horizontal plane and not in direct contact. In some embodiments, the base plate can comprise the surface directly beneath the plurality of wafers, or the top plate can comprise the surface directly underneath the plurality of wafers. In some embodiments, the base plate can comprise the surface directly beneath the plurality of wafers and be in direct contact with the wafers, or the top plate can comprise the surface directly underneath the plurality of wafers and be in direct contact with the wafers. In general, the greatest reduction in temperature non-uniformities can be obtained when the top plate comprises the same material as the plurality of wafers, when the top plate and the plurality of wafers are the same vertical distance from the base plate, and when the top plate and the plurality of wafers are the same thickness. However, other embodiments contemplate varying the material selection between the wafers and the top plate. Temperature non-uniformities in this case can be reduced with corresponding variation of relative thickness between the top plate and wafers, relative spacing over the bottom plate between the top plate and wafers, or some combination of these parameters to produce an overall arrangement. Other embodiments include a top plate that is arranged at a different vertical spacing relative to the bottom plate than the vertical spacing of the plurality of the wafer relative to the bottom plate.

In some embodiments, the top plate can be comprised of a single piece of material, or the top plate can be comprised of one or more segments. Regardless, the top plate and the base plate can be fastened together, for example, using staples comprising molybdenum or similar materials. When fastened together, the top plate and the base plate can coordinately form a wafer pocket shaped from a compound radius of two or more intersecting arcs, or the top plate and the base plate can coordinately form a wafer pocket shaped from a compound radius of two or more non-intersecting arcs. In some embodiments, a wafer carrier configured of a top plate and a base plate as described herein can reduce temperature variability during CVD processing by a factor of about 2.0, about 2.5, about 3.0, about 3.5, about 4.0, about 4.5, about 5.0, about 5.5, about 6.0, about 6.5, about 7.0, about 7.5, about 8.0, about 8.5, about 9.0, about 9.5, or about 10.

Embodiments can also include a method for reducing temperature non-uniformities in a system for growing epitaxial layers on one or more wafers by chemical vapor deposition (CVD). The method can comprise assembling a wafer carrier comprising a top plate and a base plate, wherein the top plate covers the areas of the base plate not covered by one or more wafers, and wherein the presence of the top plate reduces temperature variability during CVD processing. The top plate and the base plate can be configured as described above, with the greatest reduction in temperature non-uniformities obtained when the top plate comprises the same material as the plurality of wafers, when the top plate and the plurality of wafers are the same distance from the base plate, and when the top plate and the plurality of wafers are the same thickness.

Advantageously, the use of a top plate and a base plate, wherein the top plate covers the areas of the base plate not covered by one or more wafers, as described herein, provides better uniformity in the thermal distribution on the surface of a wafer subjected to CVD processing. A number of other advantages will become apparent from the following Detailed Description.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Figure 1:
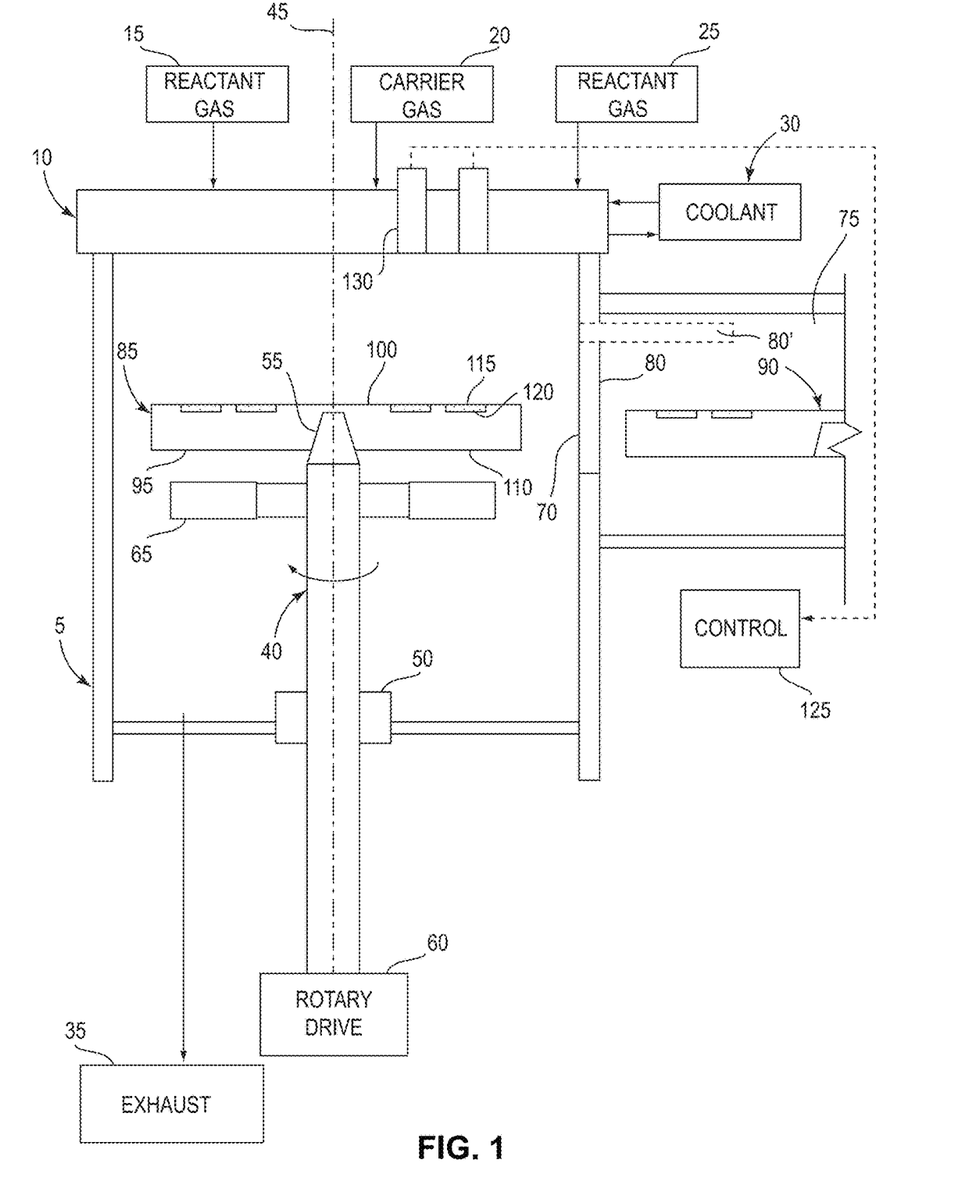
FIG. 1 illustrates a chemical vapor deposition apparatus in accordance with one embodiment of the invention.

FIG. 1 illustrates a chemical vapor deposition apparatus in accordance with one embodiment of the invention. Reaction chamber 5 defines a process environment space. Gas distribution device 10 is arranged at one end of the chamber. The end having gas distribution device 10 is referred to herein as the "top" end of reaction chamber 5. This end of the chamber typically, but not necessarily, is disposed at the top of the chamber in the normal gravitational frame of reference. Thus, the downward direction as used herein refers to the direction away from gas distribution device 10; whereas the upward direction refers to the direction within the chamber, toward gas distribution device 10, regardless of whether these directions are aligned with the gravitational upward and downward directions. Similarly, the "top" and "bottom" surfaces of elements are described herein with reference to the frame of reference of reaction chamber 5 and gas distribution device 10.

Gas distribution device 10 is connected to sources 15, 20, and 25 for supplying process gases to be used in the wafer treatment process, such as a carrier gas and reactant gases, such as a metalorganic compound and a source of a group V metal. Gas distribution device 10 is arranged to receive the various gases and direct a flow of process gasses generally in the downward direction. Gas distribution device 10 desirably is also connected to coolant system 30 arranged to circulate a liquid through gas distribution device 10 so as to maintain the temperature of the gas distribution device at a desired temperature during operation. A similar coolant arrangement (not shown) can be provided for cooling the walls of reaction chamber 5. Reaction chamber 5 is also equipped with exhaust system 35 arranged to remove spent gases from the interior of the chamber through ports (not shown) at or near the bottom of the chamber so as to permit continuous flow of gas in the downward direction from gas distribution device 10.

Spindle 40 is arranged within the chamber so that the central axis 45 of spindle 40 extends in the upward and downward directions. Spindle 40 is mounted to the chamber by a conventional rotary pass-through device 50 incorporating bearings and seals (not shown) so that spindle 40 can rotate about central axis 45, while maintaining a seal between spindle 40 and the wall of reaction chamber 5. The spindle has fitting 55 at its top end, i.e., at the end of the spindle closest to gas distribution device 10. As further discussed below, fitting 55 is an example of a wafer carrier retention mechanism adapted to releasably engage a wafer carrier. In the particular embodiment depicted, fitting 55 is a generally frustoconical element tapering toward the top end of the spindle and terminating at a flat top surface. A frustoconical element is an element having the shape of a frustum of a cone. Spindle 40 is connected to rotary drive mechanism 60 such as an electric motor drive, which is arranged to rotate spindle 40 about central axis 45.

Heating element 65 is mounted within the chamber and surrounds spindle 40 below fitting 55. Reaction chamber 5 is also provided with entry opening 70 leading to antechamber 75, and door 80 for closing and opening the entry opening. Door 80 is depicted only schematically in FIG. 1, and is shown as movable between the closed position shown in solid lines, in which the door isolates the interior of reaction chamber 5 from antechamber 75, and an open position shown in broken lines at 80'. The door 80 is equipped with an appropriate control and actuation mechanism for moving it between the open position and closed positions. In practice, the door may include a shutter movable in the upward and downward directions as disclosed, for example, in U.S. Pat. No. 7,276,124, the disclosure of which is hereby incorporated by reference herein. The apparatus depicted in FIG. 1 may further include a loading mechanism (not shown) capable of moving a wafer carrier from the antechamber 75 into the chamber and engaging the wafer carrier with spindle 40 in the operative condition, and also capable of moving a wafer carrier off of spindle 40 and into antechamber 75.

The apparatus also includes a plurality of wafer carriers. In the operating condition shown in FIG. 1, a first wafer carrier 85 is disposed inside reaction chamber 5 in an operative position, whereas a second wafer carrier 90 is disposed within antechamber 75. Each wafer carrier includes body 95 which is substantially in the form of a circular disc having a central axis (See FIG. 2). Body 95 is formed symmetrically about central axis. In the operative position, the central axis of the wafer carrier body is coincident with central axis 45 of spindle 40. Body 95 may be formed as a single piece or as a composite of plural pieces. For example, as disclosed in U.S. Patent Application Pub. No. 20090155028, the disclosure of which is hereby incorporated by reference herein, the wafer carrier body may include a hub defining a small region of the body surrounding the central axis and a larger portion defining the remainder of the disc-like body. Body 95 is desirably formed from materials which do not contaminate the process and which can withstand the temperatures encountered in the process.

For example, the larger portion of the disc may be formed largely or entirely from materials such as graphite, silicon carbide, or other refractory materials. Body 95 generally has a planar top surface 100 and a bottom surface 110 extending generally parallel to one another and generally perpendicular to the central axis of the disc. Body 95 also has one, or a plurality, of wafer-holding features adapted to hold a plurality of wafers.

Figure 2:
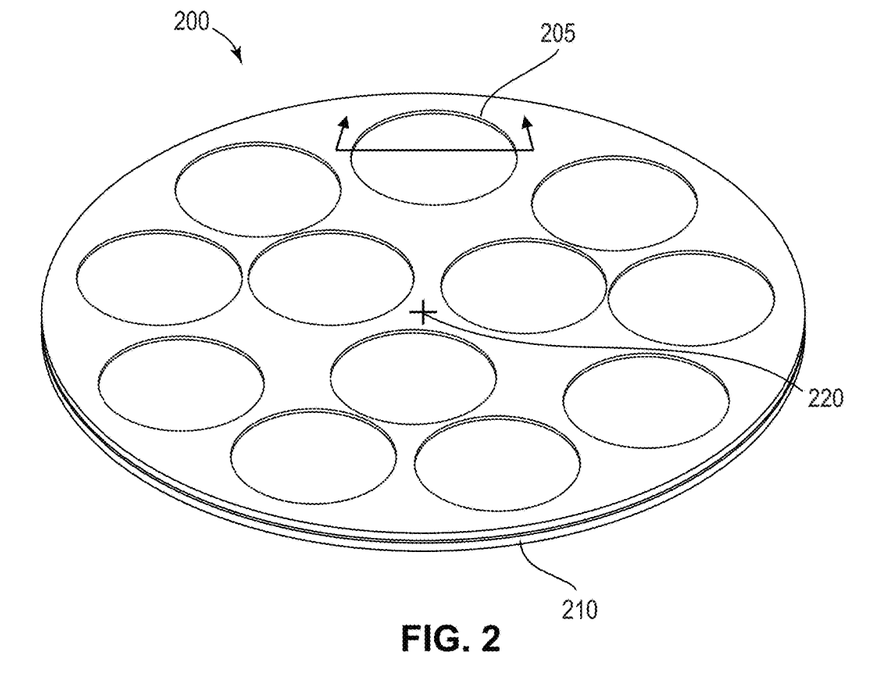
FIG. 2 is a perspective view diagram illustrating a wafer carrier used with a MOCVD system, according to one embodiment of the invention.

In operation, wafer 115, such as a disc-like wafer formed from sapphire, silicon carbide, or other crystalline substrate, is disposed within each pocket 120 of each wafer carrier. Typically, wafer 115 has a thickness which is small in comparison to the dimensions of its major surfaces. For example, a circular wafer of about 2 inches (50 mm) in diameter may be about 430 µm thick or less. As illustrated in FIG. 1, wafer 115 is disposed with a top surface facing upwardly, so that the top surface is exposed at the top of the wafer carrier. It should be noted that in various embodiments, wafer carrier 85 carries different quantities of wafers. For instance, in one example embodiment, wafer carrier 85 can be adapted to hold six wafers. In another example embodiment, as shown in FIG. 2, the wafer carrier holds 12 wafers.

In a typical MOCVD process, wafer carrier 85 with wafers loaded thereon is loaded from antechamber 75 into reaction chamber 5 and placed in the operative position shown in FIG. 1. In this condition, the top surfaces of the wafers face upwardly, towards gas distribution device 10. Heating element 65 is actuated, and rotary drive mechanism 60 operates to turn spindle 40 and hence wafer carrier 85 around axis 45. Typically, spindle 40 is rotated at a rotational speed from about 50-1500 revolutions per minute. Process gas supply units 15, 20, and 25 are actuated to supply gases through gas distribution device 10. The gases pass downwardly toward wafer carrier 85, over top surface 100 of wafer carrier 85 and wafers 115, and downwardly around the periphery of the wafer carrier to the outlet and to exhaust system 50. Thus, the top surface of the wafer carrier and the top surfaces of wafer 115 are exposed to a process gas including a mixture of the various gases supplied by the various process gas supply units. Most typically, the process gas at the top surface is predominantly composed of the carrier gas supplied by carrier gas supply unit 20. In a typical chemical vapor deposition process, the carrier gas may be nitrogen, and hence the process gas at the top surface of the wafer carrier is predominantly composed of nitrogen with some amount of the reactive gas components.

Heating elements 65 transfer heat to the bottom surface 110 of wafer carrier 85, principally by radiant heat transfer. The heat applied to the bottom surface of wafer carrier 85 flows upwardly through the body 95 of the wafer carrier to the top surface 100 of the wafer carrier. Heat passing upwardly through the body also passes upwardly through gaps to the bottom surface of each wafer, and upwardly through the wafer to the top surface of wafer 115. Heat is radiated from the top surface 100 of wafer carrier 85 and from the top surfaces of the wafer to the colder elements of the process chamber as, for example, to the walls of the process chamber and to gas distribution device 10. Heat is also transferred from the top surface 100 of wafer carrier 85 and the top surfaces of the wafers to the process gas passing over these surfaces.

In the embodiment depicted, the system includes a number of features designed to determine uniformity of heating of the surfaces of each wafer 115. In this embodiment, temperature profiling system 125 receives temperature information that can include a temperature and temperature monitoring positional information from temperature monitor 130. In addition, temperature profiling system 125 receives wafer carrier positional information, which in one embodiment can come from rotary drive mechanism 60. With this information, temperature profiling system 125 constructs a temperature profile of the wafers 120 on wafer carrier 85. The temperature profile represents a thermal distribution on the surface of each of the wafers 120.

Figure 3:
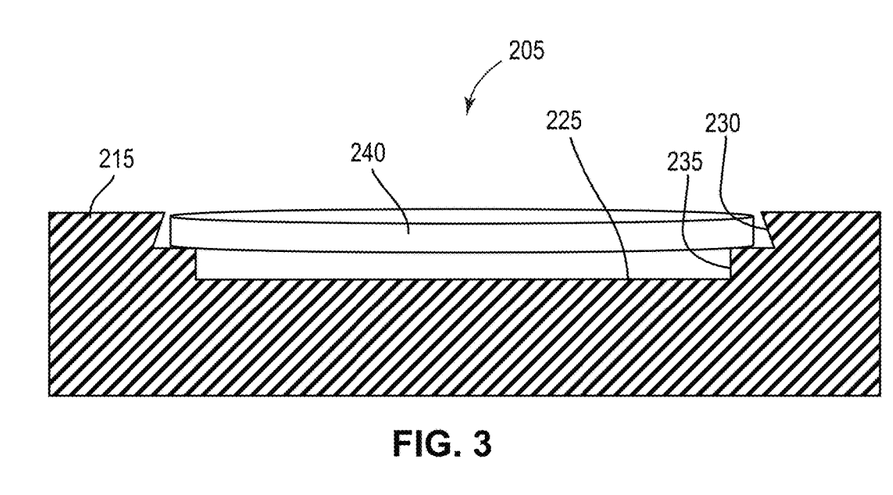
FIG. 3 is a diagram of a cross-sectional view taken along the line shown, detailing a wafer pocket used with a MOCVD system, according to one embodiment of the invention.

FIGS. 2 and 3 illustrate wafer carrier 200, also referred to as a susceptor, in greater detail. Each wafer retention site is in the form of a generally circular recess, or pocket 205, extending downwardly into body 210 from the top surface 215. FIG. 3 is a cross-sectional view of pocket 205 (demarcated with a horizontal line and two angled arrow in FIG. 2). The generally circular shape is made to correspond to the shape of wafer 240. Each wafer carrier 200 includes body 210 that is substantially in the form of a circular disc having a central axis 220. Body 210 is formed symmetrically about central axis 220. In the operative position, the central axis 220 of wafer carrier body 210 is coincident with the axis of the spindle (See FIG. 3). Body 210 may be formed as a single piece or as a composite of plural pieces. Each pocket 205 has a floor surface 225 disposed below the surrounding portions of top surface 215. Each pocket 205 also has a peripheral wall surface 230 surrounding floor surface 225 and defining the periphery of pocket 205. Peripheral wall surface 230 extends downwardly from the top surface 215 of body 210 to floor surface 225. In various embodiments, as depicted in particular in FIG. 3, peripheral wall surface 230 has an undercut where the wall slopes inwards, over at least a portion of the periphery. Thus, peripheral wall surface 230 forms an acute angle relative to floor surface 225. In one example embodiment, the angle formed between peripheral wall surface 230 and floor surface 225 is 80 degrees.

In a related embodiment (not shown), portions of peripheral wall surface 230 have varying degrees of sloping. For instance, in one such embodiment, those portions of peripheral wall surface 230 that are furthest from the central axis 220 of the wafer carrier have a more acute angle. In another related embodiment, as illustrated in FIG. 3, the pocket floor surface 225 (i.e., the top surface of base plate in the wafer pocket region) includes standoff features, such as tabs 235 located in certain locations along the periphery of each pocket 205. Tabs 235 raise wafer 240 off of pocket floor surface 225, thereby permitting some flow of gas around the edges and below the bottom surface of wafer 240. In other embodiments, wafer 240 can be raised from pocket floor surface 225 using a ring that fits inside pocket 205, just underneath peripheral wall surface 230; the ring can occupy the position of tabs 235 (i.e., in lieu of tabs), such that the outer periphery of wafer 240 rests on the ring.

Figure 4:
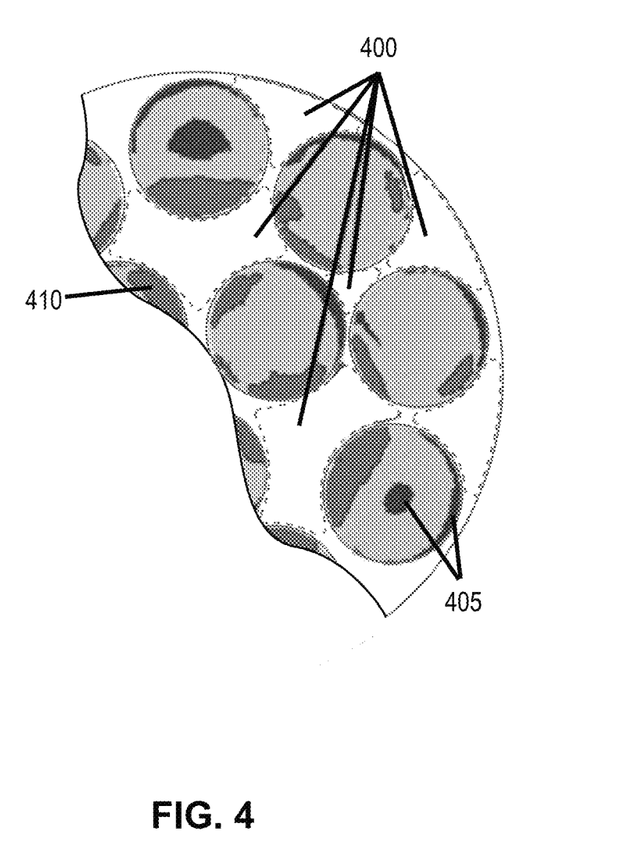
FIG. 4 is a temperature gradient profile, according to one embodiment of the invention.

Generally, wafer retention sites, or pockets, are in the form of a circular recess, extending downwardly into the body of a wafer carrier, as shown above in FIGS. 1-3. In the case of multi-wafer pockets, which often times have non-concentric pocket locations, the temperature profile (also called a thermal profile; see FIG. 4) is more varied, due to the gas streamline path passing over both the wafer carrier and wafer regions, and the significant centripetal forces involved during wafer processing. For example, in high-speed rotating disc reactors, the gas streamlines spiral outward in a generally tangential direction. In one aspect, as shown in FIG. 4, when the gas streamline is passing over exposed portions 400 (e.g., the area between the wafers) of the wafer carrier, exposed portions 400 are heated up relative to the regions where it is passing over the wafers. In general, exposed portions 400 are quite hot relative to the other regions of the carrier, as the heat flux streamlines have channeled the streamlines into this region due to the "blanketing" effect. Thus, the gas paths create a tangential gradient in temperature due to the convective cooling, which is hotter at the leading edge (entry of the fluid streamline to the wafer) relative to the trailing edge (exit of the fluid streamline over the wafer). As shown in FIG. 4, this can result in significant temperature non-uniformities on the surface of the wafer that reduce production yield. Generally, the center of the wafer surface is relatively hotter than other portions of the wafer surface due to the "blanketing" effect, as is the outside portion of the periphery of the wafer that contacts the wafer pocket (subject to centripetal force during rotation), due to the "proximity" effect (region 405). In contrast, the inside portion of the periphery of the wafer that is closest to the axis of rotation of the wafer carrier is relatively cooler (region 410).

Figure 5A:
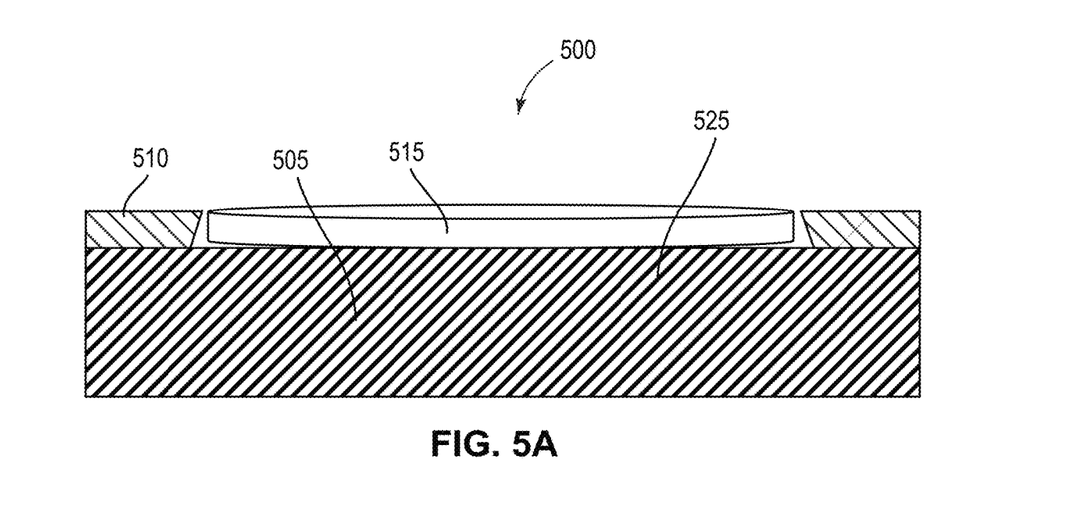
FIGS. 5A through 5E are diagrams of cross-sectional views of a pocket of a wafer carrier comprising a top plate and a base plate, according to one embodiment of the invention.

As an improved structure to maintain a more uniform temperature profile during MOCVD processing, ultimately reducing temperature non-uniformities and increasing production yield, wafer carriers according to embodiments of the invention are constructed to receive a plurality of individual top plates, each of which is sized and shaped to cover a corresponding portion of the top surface of the wafer carrier between the wafer pockets. As illustrated in FIG. 5A, a cross-sectional view of one embodiment, wafer carrier pocket 500 comprises base plate 505 and top plate 510. As depicted, top plate 510 and wafer 515 are generally in the same horizontal plane and directly contact each other (e.g., FIGS. 5A, 5C, and 5E).

Figure 5B:
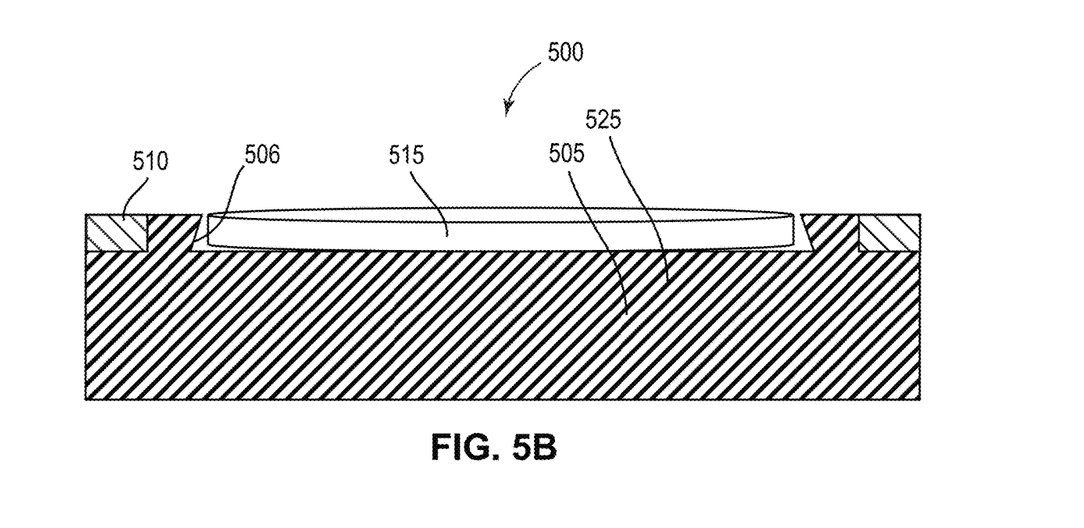
Figure 5C:
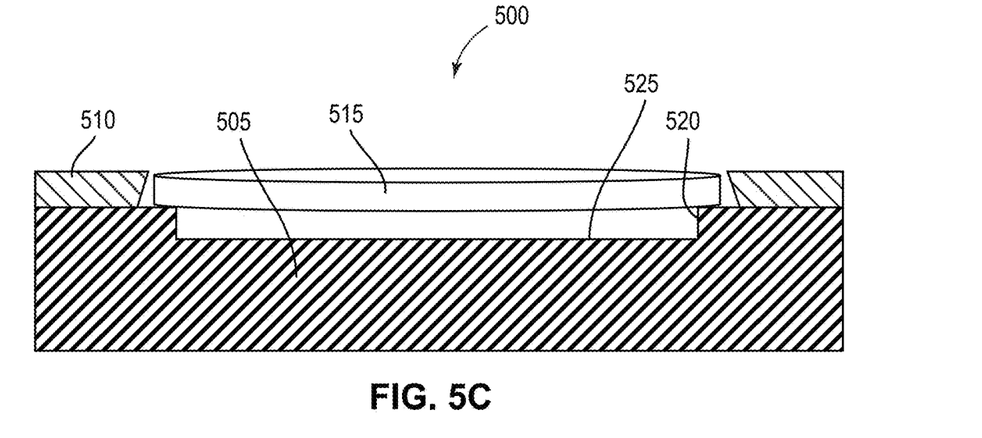
Figure 5D:
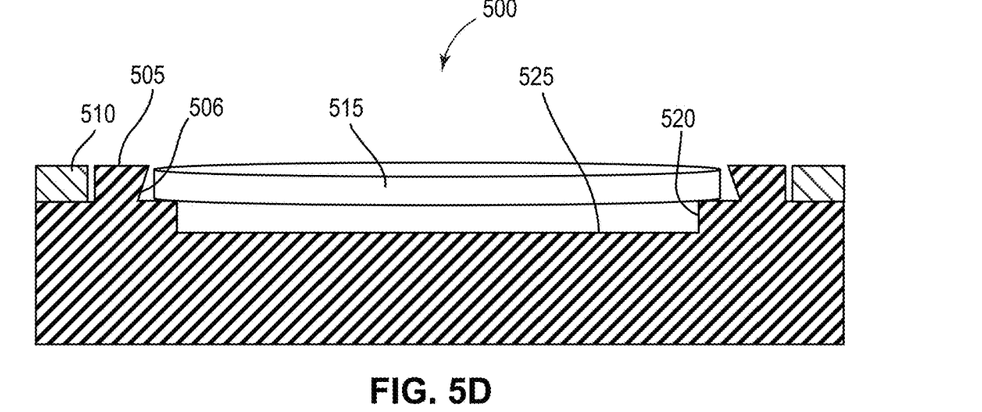
Figure 5E:
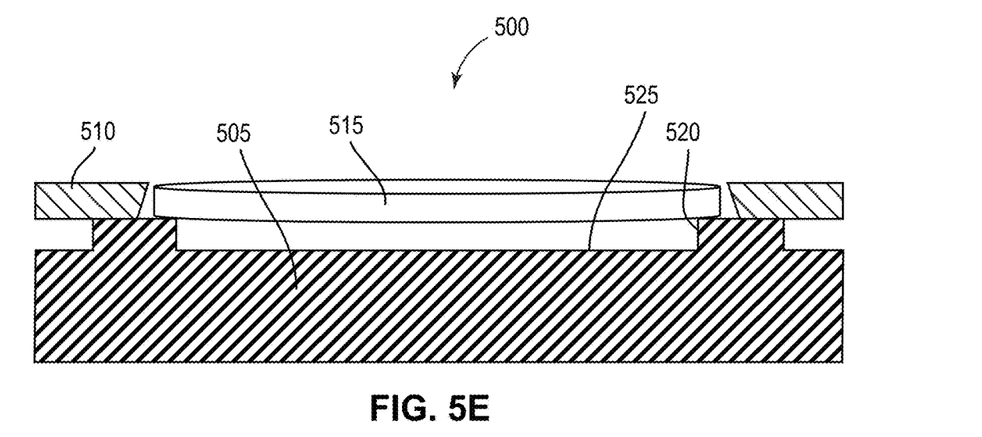

In a related embodiment, wafer 515 is situated to rest on the top surface of tabs 520 located in certain locations along the periphery of each pocket 500. This arrangement is depicted in FIGS. 5C-5E. Tabs 520 can be included to raise wafer 515 off of pocket floor surface 525 of base plate 505, thereby permitting some flow of gas around the edges and below the bottom surface of wafer 515. In related configurations, the distance between base plate 505 and top plate 510 is equal to the distance between base plate 505 and wafer 515.

As illustrated in FIG. 5E, similarly-sized tabs 520 can be formed, for example, from extensions of base plate 505 to provide the same or similar spacing between top plate 510 and pocket floor surface 525 of base plate 505, as that between wafer 515 and pocket floor surface 525 of base plate 505. Embodiments configured as such generally maintain similar heat flux in the wafer carrier body regions not covered by wafers (i.e., beneath the areas in the spaces between the wafers), as those regions covered by wafers (i.e., wafer pockets).

In some aspects, a ring-shaped step can occupy the position of tabs 520 (i.e., in lieu of tabs), such that the entire outer periphery of wafer 515 rests on the ring-step. In other embodiments, as shown in FIGS. 5B and 5D, a portion of base plate 505 can extend upward and occupy a position around the periphery of wafer 515, such that top plate 510 is generally in the same horizontal plane as wafer 515, but may not directly contact wafer 515. The portion of base plate 515 that extends upward is situated between top plate 510 and wafer 515. In related configurations, the distance between base plate 505 and top plate 510 as well as the distance between base plate 505 and wafer 515 can generally be kept equal.

Figures 6A, 6B, 6C:
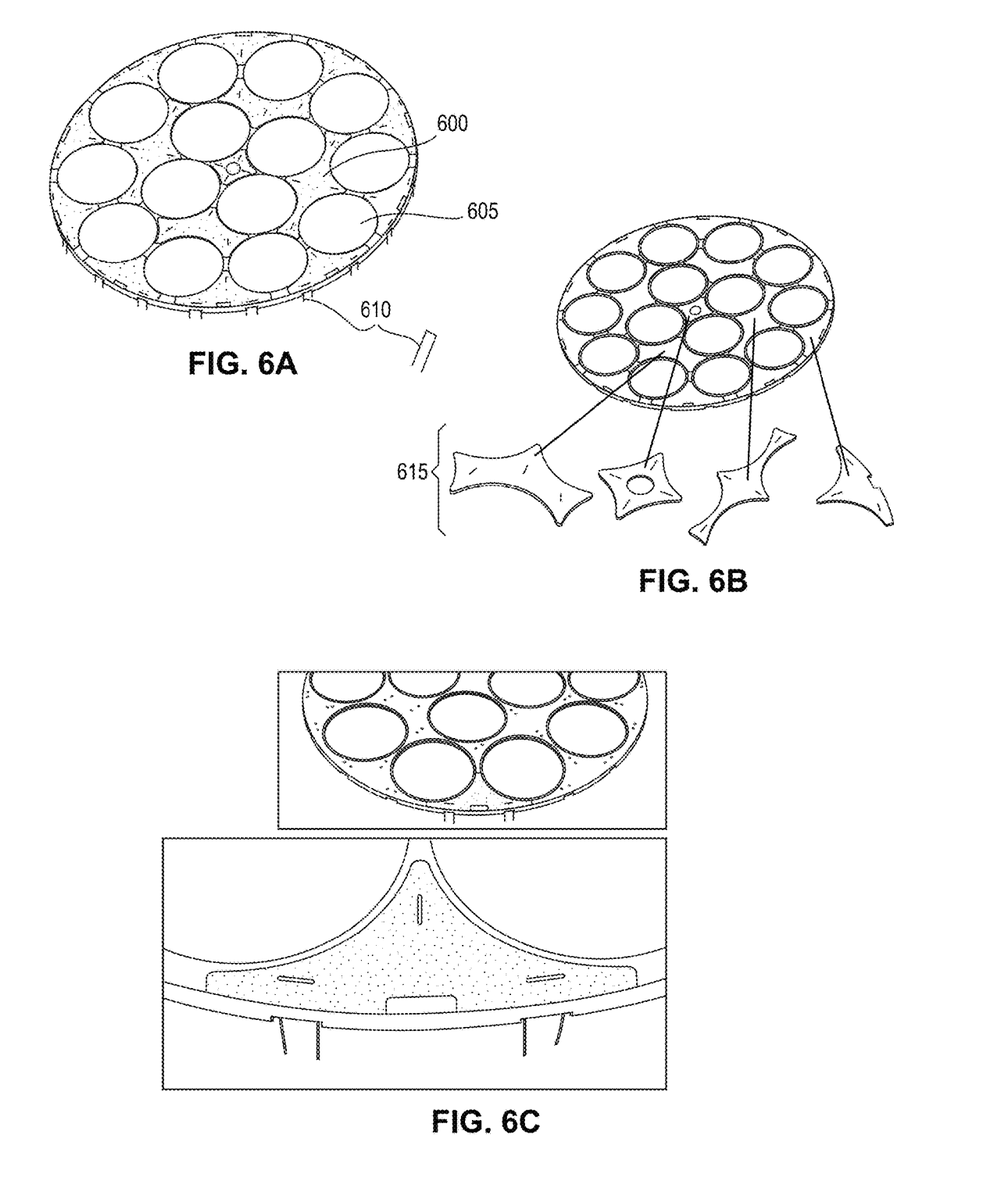
FIGS. 6A through 6C are illustrations of a top plate and top plate segments of a wafer carrier, according to one embodiment of the invention.

To create a more uniform temperature gradient across the surface of wafer 515, a wafer carrier can be constructed such that top plate 510 occupies the exposed portions of the wafer carrier (i.e., the areas not occupied by wafers; see FIGS. 4 and 6). In various embodiments, top plate 510 can be comprised of the same material as wafer 515, have the same thickness as wafer 515, and be the same distance from base plate 505. For example, if wafer 515 is comprised of sapphire, then top plate 510 will also be comprised of sapphire. If wafer 515 is comprised of silicon (Si), then top plate 510 will also be comprised of silicon (Si). Similarly, if wafer 515 is 500 microns thick, then top plate 510 will also be 500 microns thick. Additionally, if wafer 515 is 50 microns from base plate 505, then top plate will also be 50 microns from base plate 505 (see, e.g., FIG. 5E), or if wafer 515 directly contacts base plate 505, then top plate will also directly contact base plate 505 (see, e.g., FIGS. 5A and 5B). With respect to base plate 505 in such embodiments, if wafer 515 and top plate 510 are comprised of silicon or sapphire, for example, base plate 505 can generally be comprised of either solid silicon carbide or silicon carbide-coated graphite. In various embodiments, the top plate is formed from a ceramic material such as a material selected from among: quartz, solid silicon carbide, aluminum nitride, boron nitride, boron carbide, alumina or another refractory material. The selection of ceramic material for the top plate can be made in conjunction with the thickness of the top plate, and geometry of the wafer carrier's bottom plate and pocket geometry to produce a thermal insulating effect that is equivalent to the thermal insulating effect of the wafers situated in their respective pockets, thereby producing a uniform heat blanketing effect over the surface of the wafer carrier in operation. For instance, in still other embodiments, a wafer comprising silicon can be used with a base plate comprising solid silicon carbide or silicon carbide coated graphite, and a top plate comprising silicon carbide or aluminum nitride. In still other embodiments, top plate 510 can be constructed from materials that have different thermal properties than wafer 515. The difference in thermal properties can be based on emissivity, coefficient of thermal expansion (CTE), and/or thermal conductivity.

In the embodiment depicted in FIG. 5A, top plate 510 is constructed and situated to form the peripheral walls of each wafer pocket. These peripheral walls will retain the wafers during processing. FIGS. 5B and 5D illustrate other embodiments, in which the peripheral walls 506 for each wafer pocket are formed by extensions of base plate 505. This type of structure is illustrated in a perspective view in FIG. 6B. In such embodiments, top plate or top plates 510 occupy the exposed areas of the wafer carrier (i.e., the areas not occupied by wafers), and the peripheral walls 506 of the extensions of base plate 505 will retain wafers 515 during processing. Therefore, in the cross-sectional views of FIGS. 5B and 5D, the peripheral walls 506 of the extensions of base plate 505 are located between wafer 515 and top plate 510. Exemplary embodiments of such configurations are shown in FIG. 6C, wherein top plate 510 is composed of various segments.

In various embodiments, top plate 600 can be comprised of a single piece of material that covers the exposed areas of the wafer carrier but leaves holes 605 for the wafers, as shown in FIG. 6A. In such embodiments, top plate 600 surrounds each wafer, as well as the center and outer periphery of the wafer carrier. Additionally, fastening mechanisms can be used to connect top plate 600 to a base plate. For example, as shown in FIG. 6A, top plate 600 can be connected to a base plate using wire staples 610. In some cases, wire staples 610 can be comprised of molybdenum, or other suitable metal or alloy. Advantageously, the use of staples or other fastening mechanism facilitates removal of the top plate.

In another embodiment, the top plate is secured to the bottom plate using sintering, a high-temperature adhesive, or other form of permanent bonding.

In other embodiments, top plate 600 can be comprised of multiple pieces, each having a shape corresponding to an exposed area of the wafer carrier, as shown in FIG. 6B. For example, top plate segments 615 can surround the circumference of each wafer, as well as the center and outer periphery of the wafer carrier, but do not physically connect to other top plate segments 615. In various embodiments, top plate 600 or top plate segments 615 can be comprised of the same material as the wafers, have the same thickness as the wafers, and be the same distance from base plate, in order to reduce temperature non-uniformities. In related embodiments, the material between the top plate and the wafers is different, while their relative thickness is correspondingly different to produce an equivalent thermal insulating effect. Likewise, in another related type of embodiment, a difference between the spacing between the bottom plate and the wafer on the one hand, and the spacing between the bottom plate and the top plate on the other hand is compensated by suitable variation in the material, the thickness, or both properties, between the top plate and the wafers, so as to provide a uniform thermal insulation characteristic over the surface of the wafer carrier.

Figure 7A:
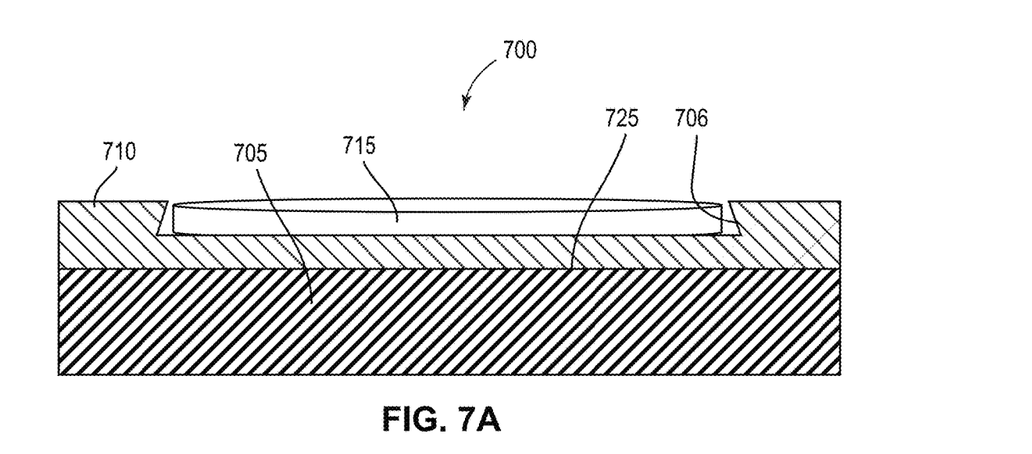
FIGS. 7A through 7C are diagrams of cross-sectional views of a pocket of a wafer carrier comprising a top plate and a base plate, according to one embodiment of the invention.
Figure 7B:
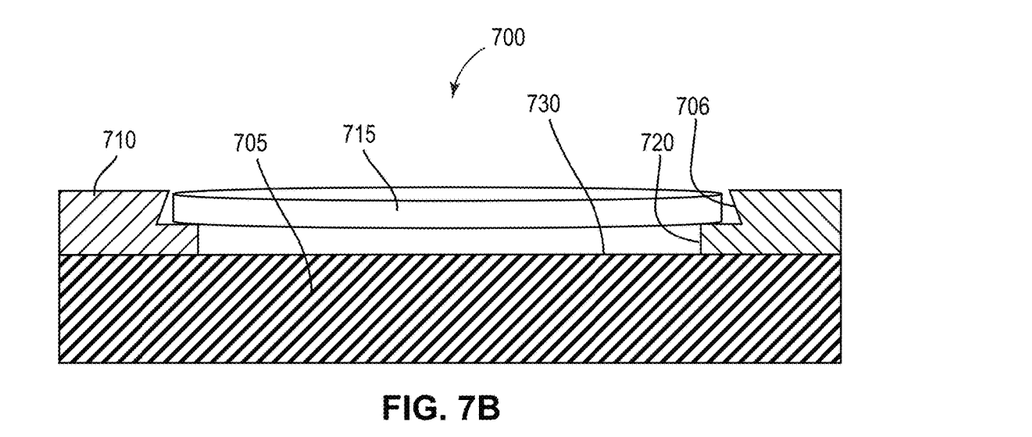
Figure 7C:
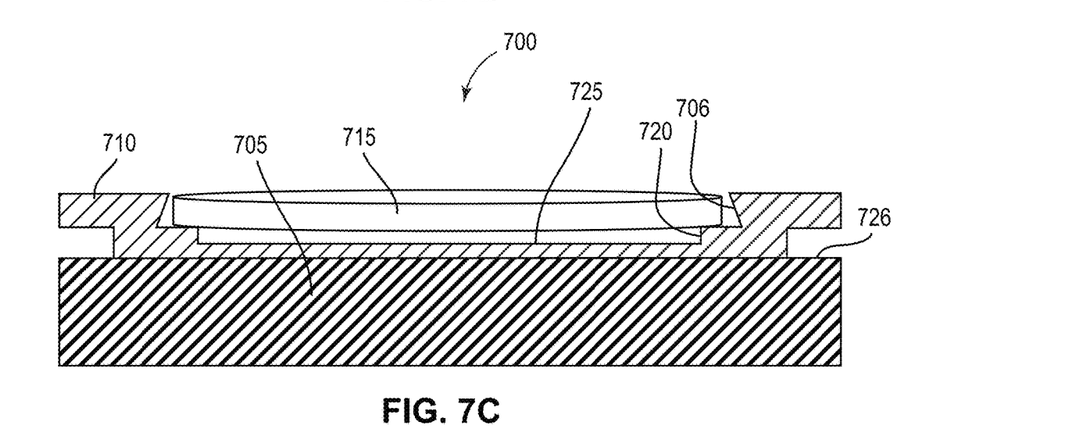

As shown in FIGS. 7A through 7C (cross-sectional views of wafer carrier pocket 700), embodiments of a wafer carrier can comprise a base plate 705 and top plate 710, such that wafer 715 is not situated to rest on any portion of base plate 705, including tabs or a ring structure of base plate 705. Instead, wafer 715 can be situated to rest directly on pocket floor surface 725 of pocket 700 created within top plate 710, as shown in FIG. 7A. In such configurations, peripheral walls 706 of wafer pocket 700 are provided by top plate 710. Peripheral walls 706 will retain wafer 715 during processing. In related embodiments, as shown in FIG. 7B, wafer 715 can be situated to rest on the top surface of tabs 720 extending outward from top plate 710. Tabs 720 can be located in certain locations along the periphery of each pocket 700, such that top plate 710 and wafer 715 are generally in the same horizontal plane and directly contact each other. Tabs 720 raise wafer 715 off pocket floor surface 730 of base plate 705, thereby permitting some flow of gas around the edges and below the bottom surface of wafer 715 (FIG. 7B).

In related embodiments, similarly-sized tabs 720 can be formed from extensions of top plate 710 to provide the same or similar spacing between top plate 710 and floor surface 726 of base plate 705 in areas not covered by wafers 715, as the spacing between pocket floor surface 725 created within top plate 710 in areas covered by wafers 715 (FIG. 7C). Embodiments configured as such maintain similar heat flux in the wafer carrier body regions not covered by wafers (i.e., beneath the areas in the spaces between the wafers), as those regions beneath the wafers (i.e., wafer pockets). As discussed above, top plate 700 can be comprised of a single piece of material that covers the exposed areas of the wafer carrier but leaves holes for wafers 715 (See FIG. 6A). In other embodiments, top plate 700 can be comprised of multiple pieces, each having a shape corresponding to an exposed area of the wafer carrier (See FIG. 6B).

Figure 8:
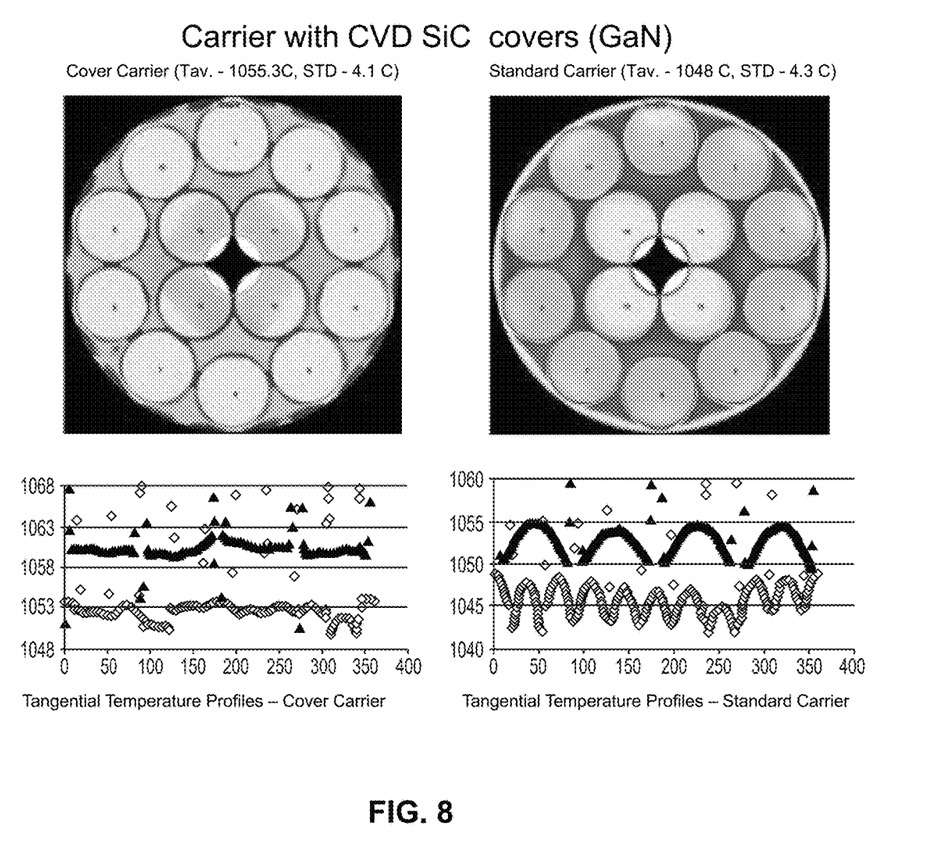
FIG. 8 illustrates and compares two temperature gradient profiles obtained using gallium nitride (GaN) wafers, according to one embodiment of the invention.
Figure 9A:
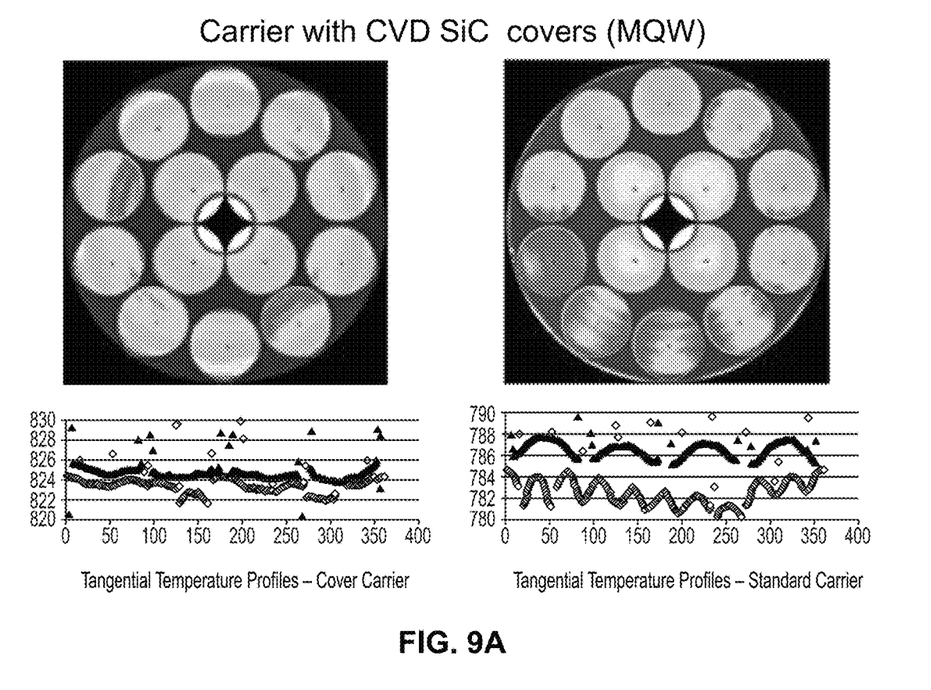
FIGS. 9A and 9B illustrate and compare two temperature gradient profiles obtained using wafers with multiple quantum wells (MQW), according to one embodiment of the invention.
Figure 9B:
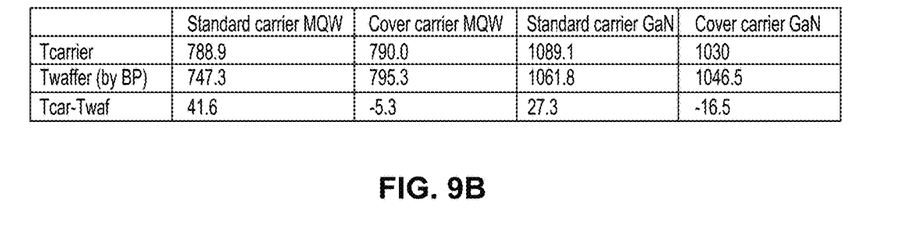

Tangential temperature gradient profiles obtained during MOCVD processing can indicate the presence and degree of temperature non-uniformities on the surface of wafers and on the exposed areas of the wafer carrier. For example, as shown in FIG. 8, the tangential temperature gradient profile indicates significant temperature variability on the surface of gallium nitride (GaN) wafers and exposed areas of the wafer carrier (right panels; "standard carrier"). However, the use of a wafer carrier comprising the top plate and base plate configurations described herein significantly reduces the temperature variability (left panels; "cover carrier"). Similar reductions in temperature variability are obtained using wafers with multiple quantum wells (MQW), as shown in the tangential temperature gradient profiles in FIG. 9A and the corresponding table summarizing the data in FIG. 9B. In some embodiments, the use of a wafer carrier comprising the top plate and base plate configurations described herein can reduce temperature variability during CVD processing by a factor of about 2.0, 2.5, 3.0, 3.5, 4.0, 4.5, 5.0, 5.5, 6.0, 6.5, 7.0, 7.5, 8.0, 8.5, 9.0, 9.5, or 10.

The embodiments above are intended to be illustrative and not limiting. Other variations are contemplated to fall within the claims. In addition, although aspects of the present invention have been described with reference to particular embodiments, those skilled in the art will recognize that changes can be made in form and detail without departing from the scope of the invention, as defined by the claims. Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, limited only according to the appended claims.

Any incorporation by reference of documents above is limited such that no subject matter is incorporated that is contrary to the explicit disclosure herein. Any incorporation by reference of documents above is further limited such that no claims that are included in the documents are incorporated by reference into the claims of the present application. The claims of any of the documents are, however, incorporated as part of the disclosure herein, unless specifically excluded. Any incorporation by reference of documents above is yet further limited such that any definitions provided in the documents are not incorporated by reference herein unless expressly included herein.

For purposes of interpreting the claims for the present invention, it is expressly intended that the provisions of Section 112(f) of 35 U.S.C. are not to be invoked unless the specific terms "means for" or "step for" are recited in a claim.

What is claimed is:

1. A wafer carrier for use in a system for growing epitaxial layers on one or more wafers by chemical vapor deposition (CVD), the wafer carrier comprising:
    a top plate made of a plurality of pieces, wherein:
        a plurality of shapes each corresponding to an exposed area of the wafer carrier that is not below the top plate are defined by two or more of the plurality of pieces,
        each one of the plurality of pieces is not in direct contact with any other of the plurality of pieces, and
        the plurality of pieces are arranged to reduce temperature non-uniformities during epitaxial growth; and
    a base plate, wherein the base plate includes surface portions arranged to support each of a plurality of wafers adjacent the exposed areas defined by the top plate, and wherein the plurality of pieces that make up the top plate are removably secured to cover areas of the base plate not covered by the plurality of wafers, such that a relative arrangement of the base plate, top plate, and the plurality of wafers produces a more uniform thermal insulating characteristic over the surface of each one of the plurality of wafers during CVD processing compared to an arrangement lacking the top plate.

2. The wafer carrier of claim 1, wherein the top plate is constructed and arranged to provide thermal insulating characteristics over the surface of the bottom plate that are equivalent to those of the wafers.

3. The wafer carrier of claim 1, wherein the top plate is constructed from a material having different thermal properties than the plurality of wafers.

4. The wafer carrier of claim 1, wherein the top plate is constructed to have a different thickness than the plurality of wafers.

5. The wafer carrier of claim 1, wherein the top plate is arranged at different vertical spacing relative to the bottom plate than the plurality of wafers.

6. The wafer carrier of claim 1, wherein the top plate comprises a similar material as the plurality of wafers.

7. The wafer carrier of claim 1, wherein the top plate comprises at least one ceramic material selected from the group consisting of: quartz, silicon carbide, solid silicon carbide, aluminum nitride, boron nitride, boron carbide, alumina.

8. The wafer carrier of claim 1, wherein the top plate and the plurality of wafers are situated along a common horizontal plane.

9. The wafer carrier of claim 1, wherein the top plate and the plurality of wafers are situated at a common vertical distance from the base plate.

10. The wafer carrier of claim 1, wherein the top plate and the plurality of wafers rest on tabs extending from the base plate, such that a gap distance between the plurality of wafers and a top surface of the base plate situated beneath each of the plurality of wafers is equivalent to a gap distance between the top plate and the top surface of the base plate.

11. The wafer carrier of claim 1, wherein the top plate and the plurality of wafers are in the same horizontal plane and wherein the top plate and the plurality of wafers are in direct contact.

12. The wafer carrier of claim 1, wherein the top plate and the plurality of wafers are in a common horizontal plane and wherein the top plate and each of the plurality of wafers are in a non-contact arrangement relative to one another.

13. The wafer carrier of claim 1, wherein the top plate and the base plate are fastened together using a plurality of mechanical fasteners.

14. The wafer carrier of claim 1, wherein the top plate and the base plate are arranged to collectively form a wafer pocket defining a peripheral wall that surrounds the circumference of each wafer.

* * * * *